United States Patent [19]

Rochat et al.

[11] Patent Number: 4,573,011

[45] Date of Patent: Feb. 25, 1986

[54] METHOD AND APPARATUS FOR TESTING ELECTRO-MECHANICAL DEVICES

[75] Inventors: Daniel F. Rochat, St-Blaise, Switzerland; Chuck C. Ogawa, Irvine; Uyen D. Bui, Placentia, both of Calif.

[73] Assignee: Nouvas Manufacturing Technology Company, Orange, Calif.

[21] Appl. No.: 496,363

[22] Filed: May 20, 1983

[51] Int. Cl.[4] .................... G01R 31/18; B65G 35/04; G01L 27/00

[52] U.S. Cl. .................... 324/158 F; 73/4 R; 198/952

[58] Field of Search .................... 324/158 R, 158 F, 73 R, 324/73 AT; 73/4 R, 40.7, 41, 41.2, 41.3, 41.4, 45, 45.1, 45.5, 45.2, 45.3, 45.4; 248/65, 89; 198/950, 952, 866

[56] References Cited

U.S. PATENT DOCUMENTS

| | | | |
|---|---|---|---|
| 1,977,703 | 10/1934 | Swartwout | 324/73 R |
| 2,747,823 | 5/1956 | Swenholt | 248/89 |
| 3,092,253 | 6/1963 | Senger | 324/73 R |
| 3,133,180 | 5/1964 | Suverkropp | 324/73 R |
| 3,249,415 | 5/1966 | McMaster et al. | 198/952 |
| 3,408,565 | 10/1968 | Frick et al. | 324/158 R |
| 3,560,849 | 2/1971 | Ryan et al. | 324/158 R X |
| 4,067,526 | 1/1978 | Storer | 248/65 |

FOREIGN PATENT DOCUMENTS

| | | | |
|---|---|---|---|
| 59-54981 | 3/1984 | Japan | 324/73 AT |

OTHER PUBLICATIONS

IBM Technical Disclosure Bulletin, Bruder, S., et al., "Tri-Air Lock Handler for Use in Testing . . . ", vol. 18, No. 8, Jan. 1976.

Instrument Society of America, Standard Specifications and Tests for Strain Guage Pressure Transducers, Reaffirmed Jan. 1976.

*Primary Examiner*—S. Clement Swisher

*Assistant Examiner*—Stephen M. Baker

*Attorney, Agent, or Firm*—Pollock, Vande Sande & Priddy

[57] ABSTRACT

A method and apparatus are disclosed for testing devices of the type having elongated flexible appendages (12, 14; 16, 18) at which test signals or responses must be applied or received. An elongated flexible carrier (40) is provided with a plurality of fixtures (44) for supporting such devices so that the free ends (14, 18) of their appendages are positioned conveniently for testing. The carrier is wound to and from large reels (124, 126) and passes through a multiple probe station (186) where each device is tested.

29 Claims, 12 Drawing Figures

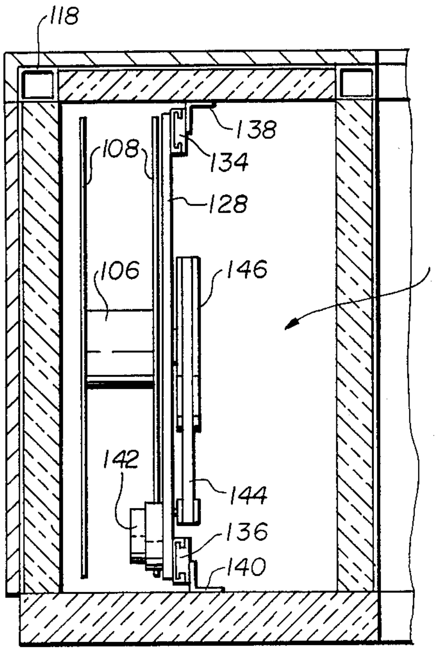
FIG 5
FIG 11
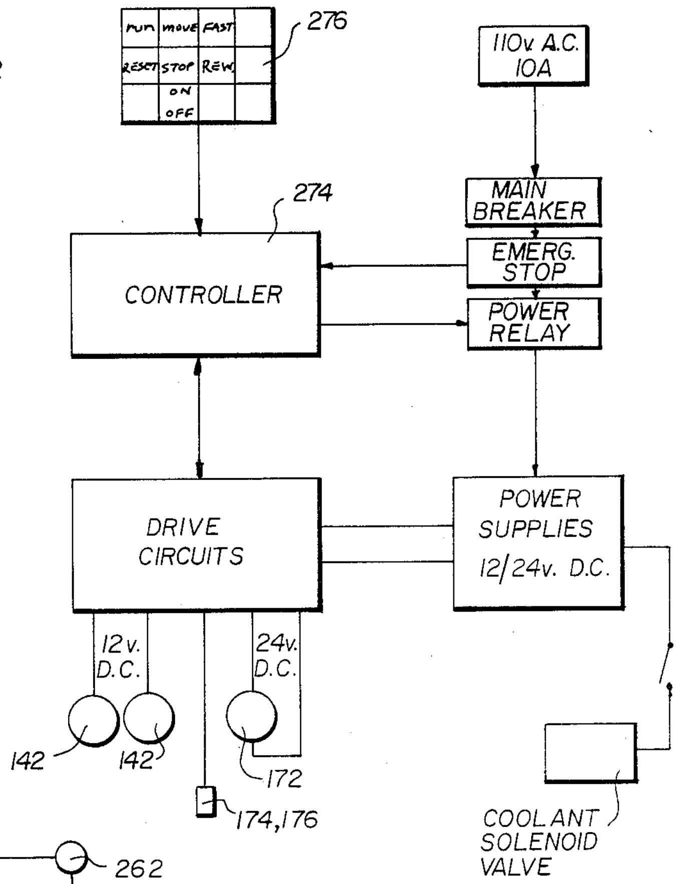
FIG 10
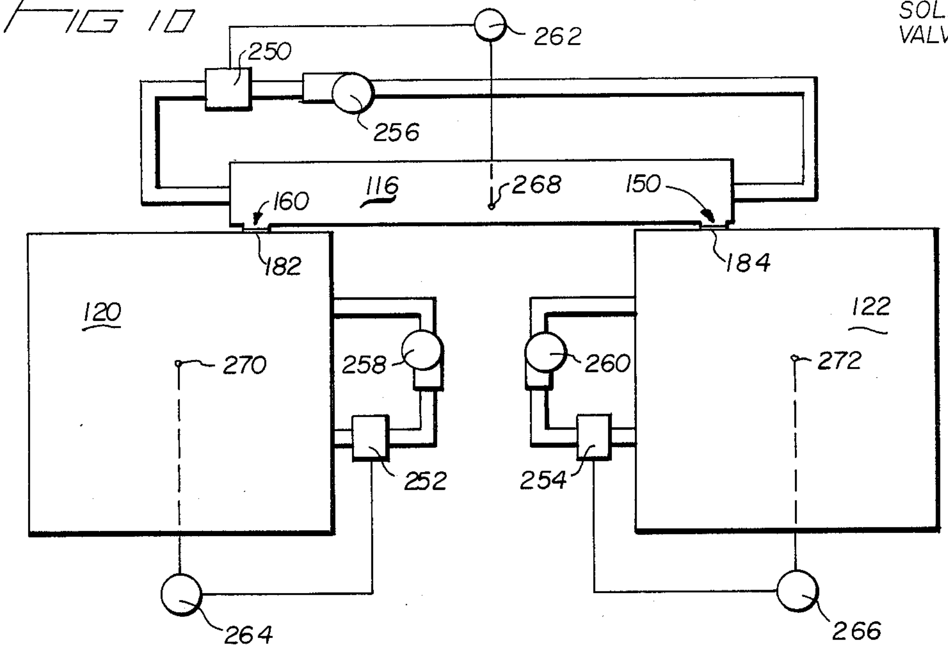

FIG 7
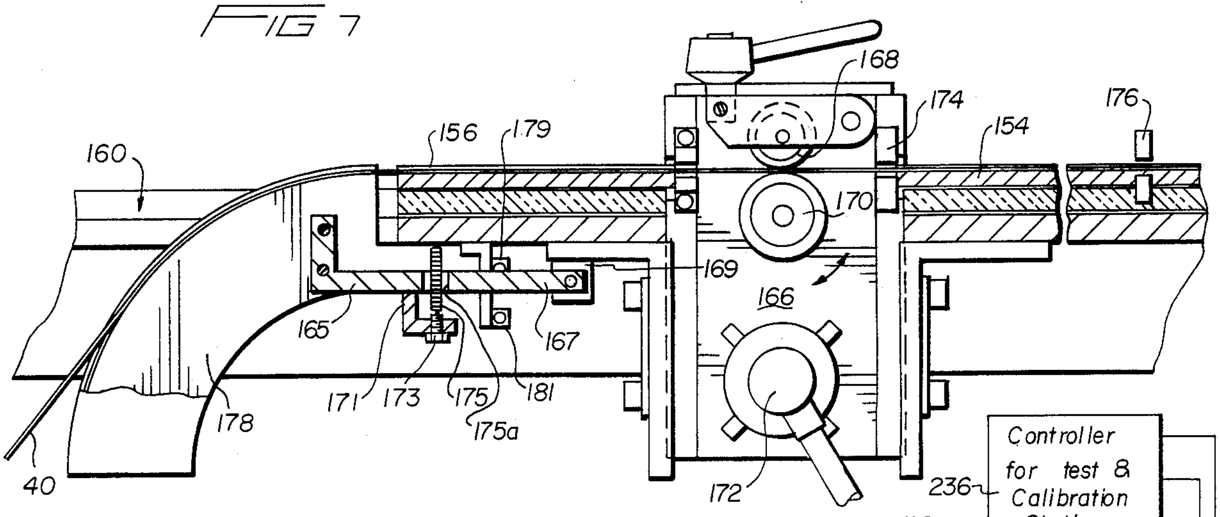
FIG 8
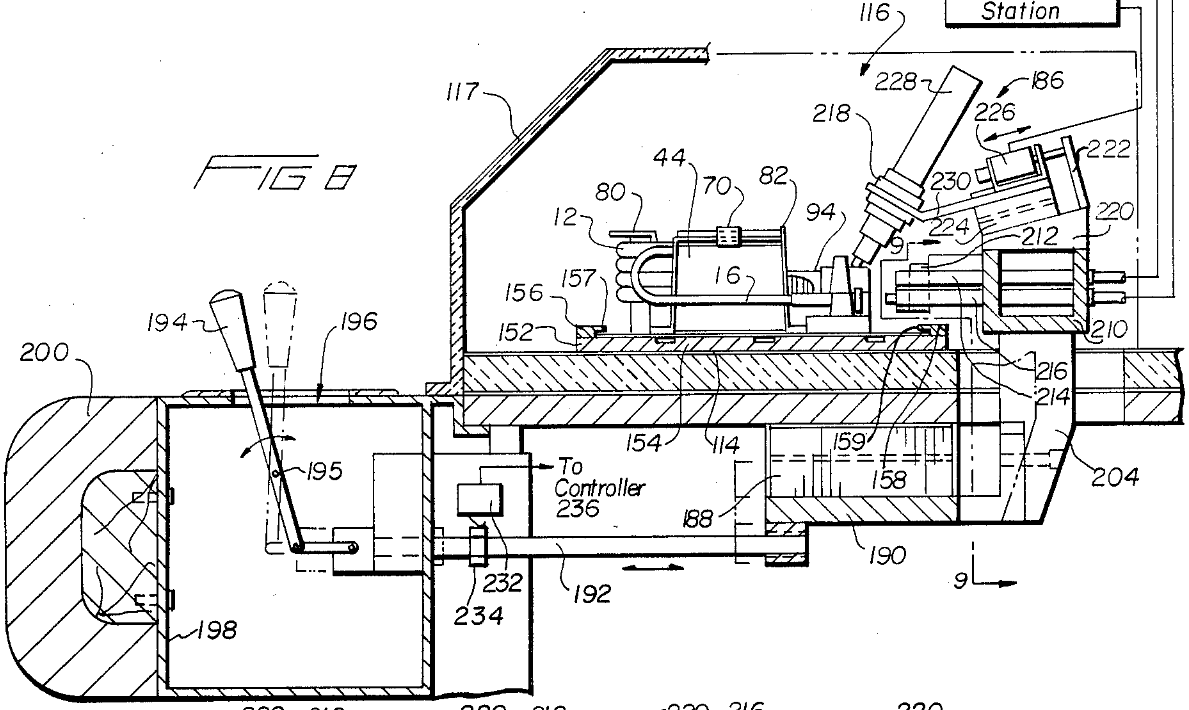
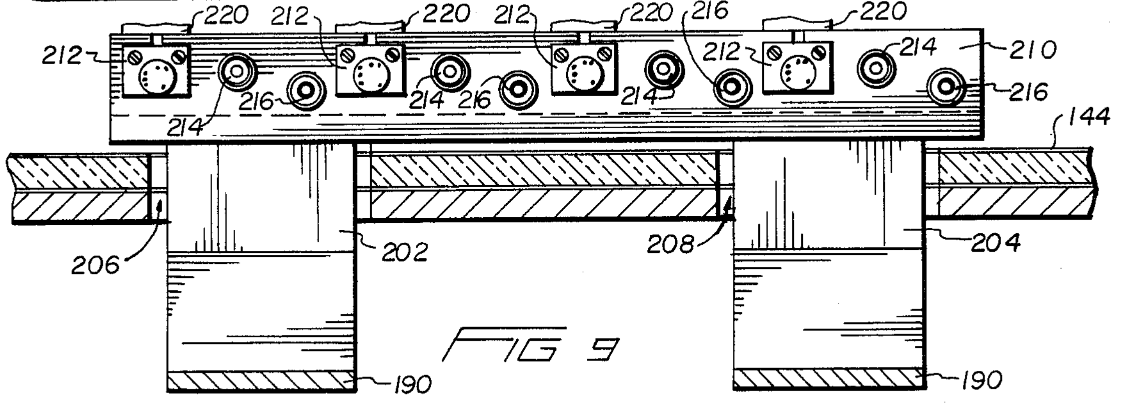
FIG 9

METHOD AND APPARATUS FOR TESTING ELECTRO-MECHANICAL DEVICES

DESCRIPTION

1. Technical Field

The present invention concerns methods and apparatuses for testing, or calibrating, electro-mechanical devices. More particularly, the invention concerns methods and apparatuses for rapid testing of force transducers, such as fluid pressure transducers, under variable ambient temperature conditions.

2. Background Art

Subsequent to manufacture of many electrical, mechanical and electro-mechanical devices, various types of testing procedures must be completed before each device can be released for distribution or sale. As used herein, the term "testing" includes calibrating. For some devices, sampling and testing of limited quantities has been found to provide adequate assurance of the quality and reliability of large numbers of devices. For other types of devices, however, testing of each individual device has been considered necessary to ensure that no substandard device is released and used in an application where its poor performance or failure could lead to an unacceptably high risk of personal injury or damage to equipment.

The cost and time required for testing 100% of the devices produced by a manufacturer can be inordinately high if each device must be separately handled by an operator during testing. A number of methods and apparatuses have been developed for automating such testing. It is known to adhere individual devices to a moving tape which passes through an automated test station after which defective devices are removed from the tape prior to packaging of acceptable devices. Another technique has been to feed devices from a magazine onto a closed loop carrier which moves the devices through a test station and then past a discharge station where the tested devices are removed from the carrier.

While methods and apparatuses of the foregoing types have proved useful for testing various types of electrical, mechanical and electro-mechanical devices, devices comprising elongated flexible appendages, such as fluid pressure conduits or electrical conductors, have proved difficult to handle by known automated techniques. For such devices, it becomes necessary to secure not only the primary body of the device but also the free ends of its appendages which often are the points at which testing signals must be applied or received. Moreover, it is desirable somehow to secure the elongated conduits and conductors themselves so that they do not become entangled with adjacent devices or with adjacent structure of the testing apparatus.

DISCLOSURE OF THE INVENTION

The primary object of the present invention is to provide a method and apparatus for rapidly testing electrical, mechanical or electro-mechanical devices of the type comprising elongated, flexible appendages, such as electrical conductors or fluid conduits at which testing and calibrating signals are to be applied and received.

A further object of the invention is to provide such a method and apparatus in which testing can be conducted at variable temperatures.

Yet another object of the invention is to provide such an apparatus in which a plurality of completed devices are secured on fixtures attached to an elongated flexible carrier such as a metal tape or strip which is wound on a large reel to facilitate handling, unwound to permit testing and rewound on another reel after testing.

Yet another object of the invention is to provide such a method and apparatus in which devices whose performance does not satisfy predetermined criteria are readily identified for subsequent repair.

These objects of the invention are given only by way of example. So, other desirable objectives and advantages inherently achieved by the disclosed method and apparatus may occur or become apparent to those skilled in the art. Nonetheless, the scope of the present invention is to be limited only by the appended claims.

In accordance with one aspect of the invention, an improved carrier is provided for use in testing or a plurality of devices of the type comprising a body portion having extending therefrom at least one elongated flexible appendage, such as an electrical conductor or fluid conduit with a free end. The carrier is particularly useful for testing and calibrating small blood pressure transducers intended for use in intensive care units of modern hospitals. To this end, the carrier comprises an elongated flexible strip suitable for being wound on a reel and made from a material such as thin stainless steel. Attached to this strip are a plurality of means for holding separately each body portion of a plurality of devices such as blood pressure transducers. Means are also provided on the strip for coiling the elongated flexible appendages of the transducer and means for positioning separately the free ends of these appendages to facilitate application and/or receipt of test signals to or from each transducer. Finally, means are provided on the strip for spacing successive coils of the strip when the strip is wound upon a reel. In the preferred embodiment of the invention, the free ends of such appendages and other points on the transducer for application of test signals are positioned to extend along parallel axes at one side of the carrier strip, to facilitate application of test probes to the transducer.

In the preferred embodiment, the means for holding, coiling, positioning and spacing various elements of the transducer are comprised in a single molded fixture for each device. So that attachment of the fixture to the flexible carrier will not substantially impair the flexibility of the carrier, the fixture is secured by a plurality of fasteners positioned substantially on a line extending transverse to the strip. As a result, the strip can flex away from the fixture about such a transverse line. In one embodiment, the means for coiling an elongated flexible appendage and the means for spacing successive coils of the strip are constituted in a single post member which extends outward from the carrier strip.

In the testing apparatus according to the invention, a carrier strip of the type previously described is wound on a large reel positioned within a first, temperature-controlled chamber from which the carrier strip is withdrawn into a second temperature controlled testing chamber. Within the second chamber, a plurality of testing probes are positioned adjacent to the path of movement of the carrier strip. As the carrier strip is intermittently moved or stepped through the second chamber, the probes are intermittently engaged with successive groups of transducers to measure their response to changing pressure levels applied by the probes. Transducers which fail to satisfy predetermined criteria are marked for subsequent treatment and the carrier strip is led from the second chamber into a third chamber where the carrier strip is wound on a second reel. In accordance with the invention, the temperatures in the various chambers are changed and the carrier strip is run back and forth from reel to reel to facilitate testing each transducer at two or more ambient temperatures and a plurality of pressures. It is also within the scope of the invention to provide a single temperature controlled chamber through which the carrier strip is intermittently moved and within which a plurality of probe stations are provided for testing groups of transducers.

BRIEF DESCRIPTION OF THE DRAWINGS

FIG. 5 shows a section view taken along line 5—5 of FIG. 3 illustrating the reel support structure of a temperature-controlled reel chamber.

FIG. 7 shows a sectional view taken along line 7—7 of FIG. 4, indicating the preferred arrangement of the drive capstan and dancer mechanism.

FIG. 8 shows a sectional view taken along line 8—8 of FIG. 3 illustrating the probe station according to the invention.

FIG. 9 shows a view taken along line 9—9 of FIG. 8 illustrating the front faces of the probes for testing four transducers.

FIG. 10 shows a schematic view of the system used for providing a temperature-controlled testing environment.

FIG. 11 shows a schematic representation of the control system used for moving a flexible elongated carrier through the apparatus.

BEST MODE FOR CARRYING OUT THE INVENTION

Figure 1:
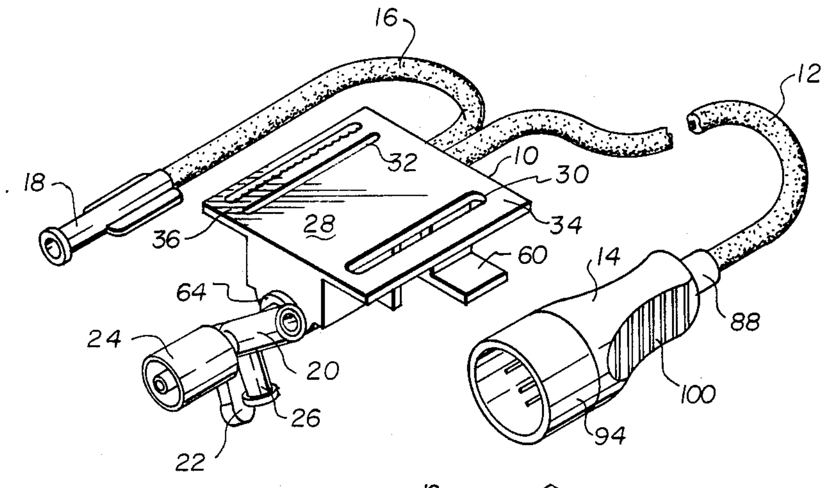
FIG. 1 shows a perspective view of a blood pressure transducer which is representative of the type of device for which the method and apparatus of the present invention are particularly well-suited.

The following is a detailed description of a preferred embodiment of the invention, reference being made to the drawings in which like reference numerals identify like elements of structure in each of the several Figures.

FIG. 1 shows a perspective view of a fully assembled blood pressure transducer which is an electro-mechanical device of the type for which the present invention is particularly suited. Such a device includes elongated appendages such as flexible fluid conduits and/or flexible electrical connectors at which test signals are to be applied or received. The illustrated device comprises a transducer body 10 which typically would enclose a pressure sensing diaphragm, an electro-mechanical displacement measuring flexure beam and associated electrical and mechanical elements, not illustrated, which comprise no part of the present invention. Extending from housing 10 is an elongated electrical conductor 12 including a plurality of conductors used to power a measuring bridge associated with the flexure beam previously mentioned and to deliver signals indicative of the pressure measured by the transducer to an external monitoring device. The free end of conductor 12 is provided with a pin connector plug 14.

An elongated fluid conduit 16 is connected to the interior of housing 10 for the purpose of conveying sterile solution into the transducer for flushing the device and for filling an associated cannula, not illustrated. A conventional intravenous connector 18 is attached to the free end of conduit 16 to permit attachment to a suitable source of such sterile solution. Finally, a three-way valve 20 is attached to housing 10. This valve comprises an actuator handle 22, a connector fitting 24 for attachment to a cannula to be inserted into the vein of a patient and a vent or drain port 26. Valve 20 can be positioned to connect the interior of body 10 to drain port 26, the interior of body 10 to a cannula attached to fitting 24, or such a cannula to drain port 26.

In use, the surface 28 of housing 10 typically is held against the patient's body by means of a strap or the like which extends through a pair of slots 30, 32 provided in flanges 34, 36 extending transversely from housing 10 as illustrated. In accordance with accepted procedures, the associated cannula is inserted into a blood vessel of the patient and an hydraulic connection is established between the patient and the transducer so that the transducer will measure the blood pressure of the patient and produce a suitable signal via conductor 12 and connector 14.

Figure 2A:
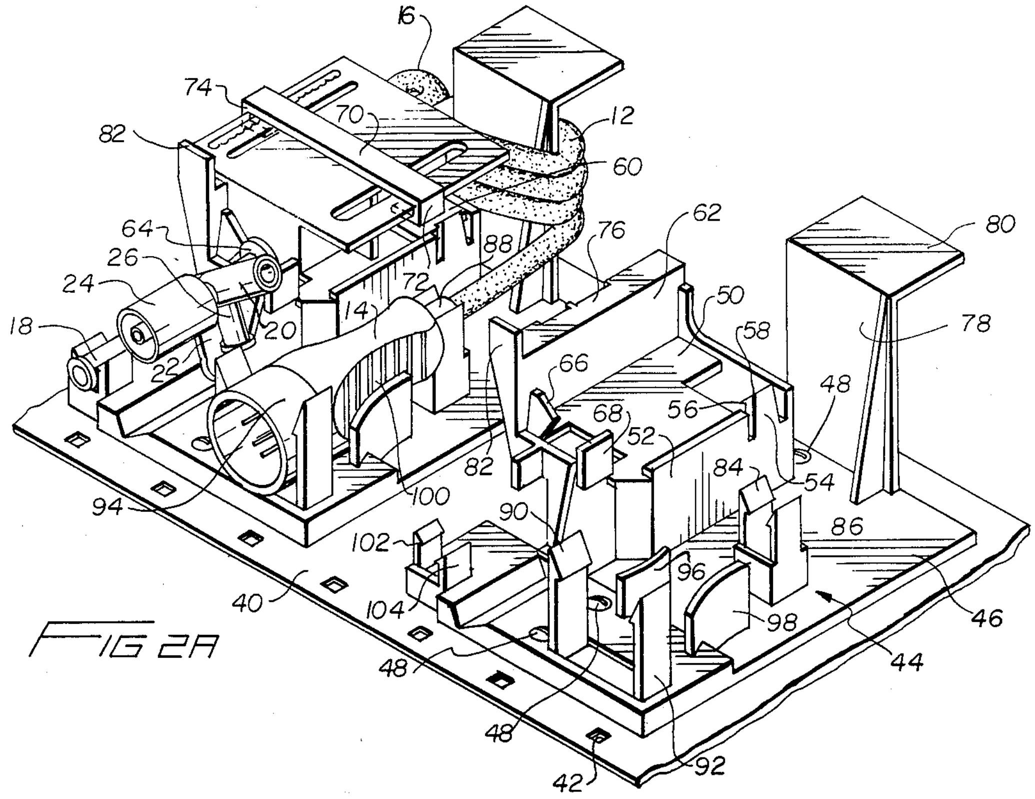
FIG. 2A shows a perspective view of a segment of an elongated flexible carrier strip on which a pair of fixtures according to the present invention have been mounted, one fixture being unoccupied and the other fixture being occupied by a transducer of the type shown in FIG. 1.

FIG. 2A shows a multiple device carrier according to the invention which can be used to test transducers of the general type shown in FIG. 1 or other electrical, mechanical or electro-mechanical devices having similar elongated flexible appendages with free ends at which testing signals are to be applied or received.

An elongated flexible strip 40, only a segment of which is illustrated, is provided which preferably is made from a material such as 0.0006 inch thick stainless steel having an appropriate width. In the illustrated embodiment, strip 40 is 4 inches wide and is provided with a plurality of accurately sized and positioned apertures 42 along at least one of its edges. These apertures are used for positioning strip 40 during testing, as will be subsequently described. In one actual embodiment of the invention, strip 40 was 50 feet in length and accommodated more than 250 injection molded positioning fixtures 44 of the type illustrated. A separate fixture was provided for each transducer to be tested, each fixture being made from a material such an Nylon, Delrin or Zytel. Those skilled in the art will understand, however, that other modern plastic materials may be used which have the requisite flexibility and stability at a given test temperature.

Each fixture 44 comprises a more or less rectangular base 46 which is secured to strip 40 by a plurality of fasteners 48, such as pop rivets, screws or the like positioned substantially on a common line extending transversely to strip 40, as illustrated. This arrangement of fasteners 48 on a common line ensures that as strip 40 flexes during coiling on a reel, the strip can flex away from the underside of base 46 to a considerable extent so that the flexibility of the strip is substantially unaffected by attachment of the fixtures 44.

A support platform 50 for the body 10 of the transducer is positioned above base 46 by an upwardly extending support wall 52. At one end of support platform 50, an upwardly extending flexible latching finger 54 is formed in wall 52. Finger 54 comprises a laterally extending locking flange 56 having on its upper side an upwardly sloping cam surface 58. Thus, when the body 10 of the transducer is pressed down onto support platform 50 as illustrated, a laterally extending tab 60 provided on body 10 presses against cam surface 58, causing latching finger 54 to deflect sideways and permit tab 60 to pass, after which latching finger 54 snaps back and locking flange 56 engages the upper surface of tab 60. On the side of support platform 50, opposite to latching finger 54, the body 10 of the transducer bears against an upwardly extending retaining wall 62 so that the transducer body is secured against movement in the axial direction of carrier strip 40.

A cylindrical boss on transducer housing 10 surrounds the joint between housing 10 and valve 20. To limit movement of the transducer transverse to the axis of carrier strip 40, boss 64 is positioned between a pair of upwardly extending tabs 66, 68. Though typically not required, to hold transducer body 10 in place on support platform 50, one or more clips 70 may be provided, each clip having at its opposite ends depending hook portions 72, 74, illustrated partly in phantom, which may be snapped over flanges 34, 36 and also over a flange 76 which extends laterally from retaining wall 62, as illustrated. Whether such clips are used or not, transducer body 10 is secured by fixture 44 so that fitting 24 extends along an axis essentially parallel to carrier strip 40 but perpendicular to a plane normal to the edge of carrier strip 40.

To position electrical conduit 12 so that it will neither be damaged during testing nor interfere with movement of carrier strip 40 through the testing apparatus subsequently to be described, an upwardly extending coiling post 78 is provided on base 46. Post 78 terminates in a transversely extending retaining flange 80 which also functions as an intercoil spacer when carrier strip 40 is wound upon a reel in the manner subsequently to be discussed. That is, the upper surface of flange 80 is positioned further from base 46 than any portion of transducer body 10 or clip 70, if a clip is used. As a result, when carrier strip 40 is wound in a coil on a reel, flange 80 contacts the underside of carrier strip 40 in the succeeding turn of the coil, thereby preventing damage to the transducers during winding and unwinding of the carrier strip. A further intercoil spacer tab 82 may be provided at the end of platform 50 furthest from post 78, to provide additional assurance against damage during winding and unwinding.

Electrical conductor 12 is wound around post 78 in the manner illustrated in FIG. 2A and connector plug 14 is secured by a pair of juxtaposed flexible latching fingers 84, 86, each similar to latching finger 54, which grip the cylindrical boss 88 at the inner end of connector plug 14. A further pair of juxtaposed flexible latching fingers 90, 92 also similar to latching finger 54, grip the cylindrical portion 94 at the outer end of connector plug 14. Between latching fingers 84, 86 and latching fingers 90, 92, a pair of spaced, curved retainer walls 96, 98 engage the finger gripping indentations 100 on connector plug 14, to prevent plug 14 from rotating. As a result, connector plug 14 is positioned with the axes of its connector pins extending parallel to the axis of fitting 24. Some elongated flexible appendages may be subject to unwanted crimping, twisting or other deformation when coiled in the manner shown in FIG. 2A. In such cases as shown in FIG. 2B, conductor 12 may be wound more loosely around post 78, 80; between latching fingers 84, 86 and retainer walls 96, 98; and around support platform 50, before connector plug 14 is positioned.

Finally, connector 18 is held on the far side of base 46 by a pair of juxtaposed flexible latching fingers 102, 104, similar to latching finger 54, which grip the cylindrical portion of connector 18, as illustrated. Thus, electrical connector plug 14, fluid fitting 18 and fluid fitting 24 are all secured by fixture 44 so that they face toward a single side of carrier strip 40 in position to cooperate with appropriate test probes in the manner now to be described.

Figure 2B:
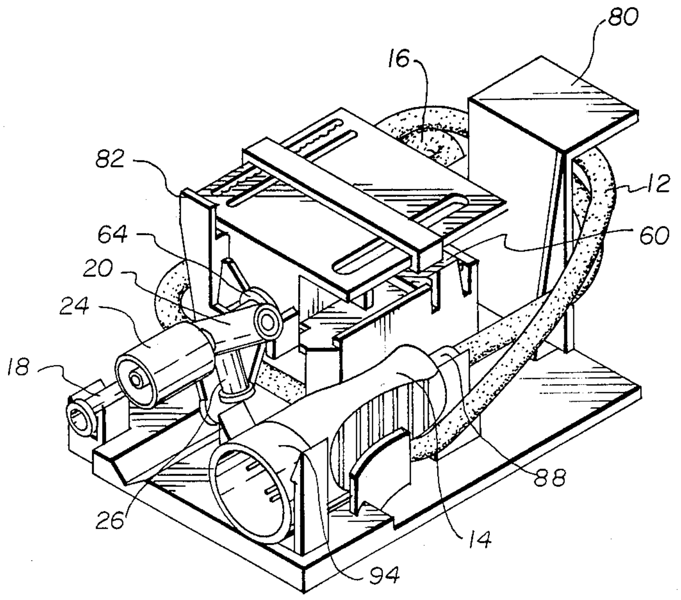
FIG. 2B shows a perspective view of a fixture occupied by a transducer, the elongated electrical connector of the transducer being wound in a different manner than is illustrated in FIG. 2A.

With reference to FIGS. 3–6, the manner of using a flexible carrier having a plurality of fixtures of the type shown in FIGS. 2A and 2B can be understood. After each fixture 44 has been provided with a transducer to be tested or calibrated, the carrier is coiled around a large reel of the type shown in FIGS. 3 and 5. As illustrated, each reel comprises a central hub 106 to which one end of carrier strip 40 is attached by any suitable means. In the illustrated embodiment vertically positioned reels are used and each reel comprises a pair of circular retention flanges 108 attached to each end of hub 106, as seen in FIG. 5. Of course, should it be desirable to configure the apparatus so that horizontally mounted reels could be used, only a lower retention flange would be required. In one actual embodiment, each reel was approximately 34 inches in diameter and approximately 4.85 inches wide, though somewhat small reels have been illustrated, in proportion to the rest of the apparatus. Reels of this type are used in the testing apparatus shown in FIGS. 3–11.

Figures 3, 4:
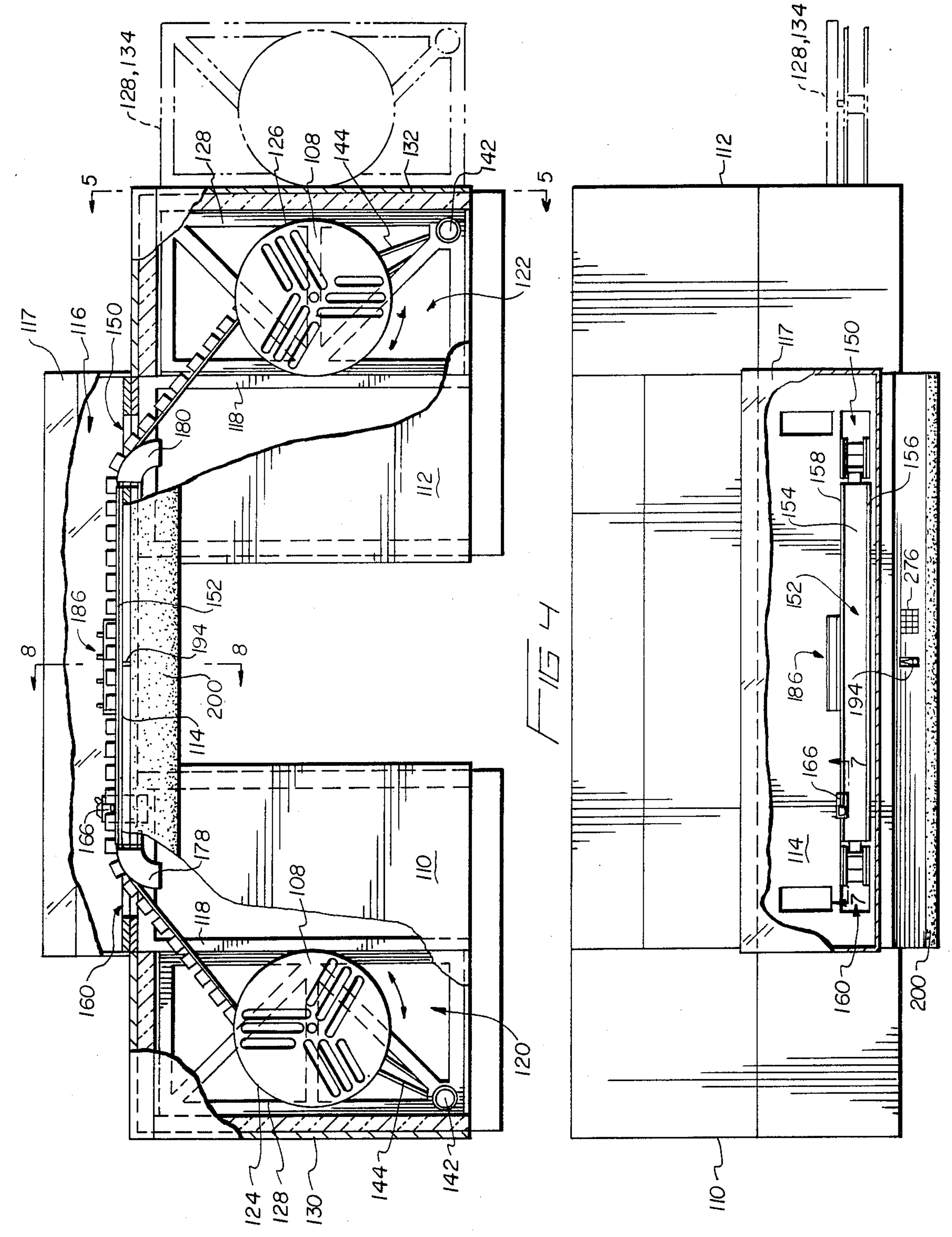
FIG. 3 shows a front elevation view, partially broken away and partially in phantom, of a testing apparatus according to the present invention.
FIG. 4 shows a top view, partially broken away and partially in phantom, of the apparatus illustrated in FIG. 3.

A pair of pedestals 110, 112 are provided which support a testing table 114. A test chamber 116 is defined above table 114 by a transparent glass or plastic cover 117 which preferably is hinged to table 114. Each pedestal 110, 112 comprises a box-like framework 118 of conventional construction such as square steel tubing. At the outermost ends of each pedestal, thermally insulated chambers 120, 122 are provided for housing supply and take-up reels 124, 126 of the type previously described. As shown in FIGS. 3 and 5, each reel preferably is mounted in its chamber on a carriage frame 128 which engages and is supported by upper and lower telescoping ball slides 134, 136 of conventional design. Slides 134, 136 are attached to frame 118 by suitable mounting brackets 138, 140. Thus, once insulated end panels 130, 132 have been removed from pedestals 110, 112, frames 118 can be pulled on their slides from their associated chambers, as indicated in phantom in FIGS. 3 and 4, to positions in which reels 124 and 126 can be removed. Preferably, the reels at both ends are mounted in this manner; however, it is also within the scope of the invention to provide removable front panels which would eliminate the need for slides 134, 136 but would complicate the initial threading of the carrier strip through the apparatus. Each reel 124, 126 is driven and braked by its own direct current motor and clutch unit 142 mounted on frame 128. A timing belt 144 extends between the output pulley of motor 142 and a larger pulley 146 mounted on the support shaft for each reel.

The motors 142 help to rotate their reels and maintain tension on carrier strip 40.

Figure 6:
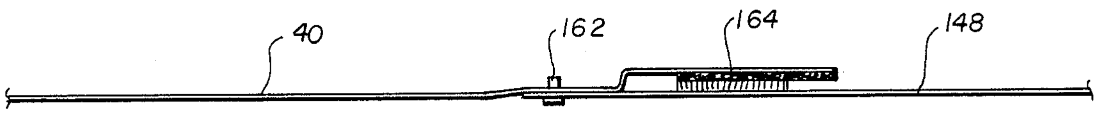
FIG. 6 shows a side view of a joint used between an elongated flexible carrier and a leader strip from a take-up reel.

In use of the apparatus illustrated in FIGS. 3–11, a reel already fully wound with a carrier strip 40, a plurality of fixtures 44 and attached transducers is mounted on the carriage frame 128 associated with chamber 120. For this purpose the carriage frame is pulled out of the chamber. The take-up reel 126 is provided with a long leader strip 148, the free end of which is illustrated in FIG. 6. Leader strip 148 is threaded from take-up reel 126 through an opening 150 from chamber 122 into chamber 116 where it is threaded into a guide 152 attached to the upper surface of table 114 as shown in FIGS. 3, 4, 7 and 8. Guide 152 is positioned entirely within chamber 116 and comprises an elongated base plate 154 and a pair of marginal guide strips 156, 158 which extend in parallel along the edges of base plate 154. Each guide strip comprises an inwardly projecting flange 157, 159 which extends above the surface of base plate 154 to hold the carrier strip 40 or leader strip 148 down as it moves along the upper surface of base plate 154.

After leader strip 148 reaches the opposite end of guide 152, it is passed through an opening 160 leading from chamber 116 into chamber 120 and pulled from chamber 120 to a point where, as illustrated in FIG. 6, a connector pin or set of pins 162 supported by leader strip 148 can be inserted into a corresponding aperture or apertures (not shown) in the free end of carrier strip 40. Simultaneously, a hook and pile fastener 164 is engaged between the two strips. Supply reel 124 and its carriage 128 are then moved into chamber 120, after which end panel 130 is replaced, leaving the overall apparatus in condition for testing of the transducers stored on reel 126.

In order to drive carrier strip 40 through chamber 116, a drive capstan 166 is provided adjacent to guide 152, as illustrated in FIGS. 3, 4 and 7. A suitable capstan for this purpose is Model No. RM93 manufactured by Baur S.A. of 2024 St. Aubin-Sauges, Switzerland. In drive capstans of this type, carrier strip 40 is clamped between an idler wheel 168 and a resilient drive wheel 170 which is rotated through a suitable gear train by means of a direct current motor 172. To accurately position carrier strip 40 for testing operations, two light source and photocell pairs 174, 176 are spaced along the edge of guide 152 so that their light beams are regularly interrupted by the portions of carrier strip 40 between accurately positioned apertures 42. As a result, when each light beam is passing through an associated aperture 42, the position of carrier strip 40 on guide 152 is known with considerable accuracy. Preferably, the spacing between light source and and photocell pairs 174, 176 is equal to the spacing between the number of transducers to be simultaneously tested. For most accurate positioning, the beam of each photocell pair is established simultaneously with the beam of both other; for instance, the beams are established just as the leading edge of an aperture reaches each photo cell pair.

To prevent excessive bending of carrier strip 40 as it moves to and from guide 152, a pair of pivoted curved guides 178, 180 are provided at openings 150, 160 to facilitate movement of the carrier strip as shown in FIGS. 3 and 7. Referring again to FIG. 7, curved guide 178 is supported on an arm 165 which is pivoted at its opposite end 167 to a bracket 169 attached to the underside of table 114 near the edge of opening 160. An angle bracket 171 extends downwardly from arm 165 and supports a tension adjustment screw 173 which is connected to a tensioning coil spring 175 extending upwardly through an opening 175*a* in arm 165. The other end of spring 175 is connected to the underside of table 114. As a result, curved guide 178 is constantly urged upward to its illustrated position to maintain tension in carrier strip 40. This type of tensioning mechanism is known in the art as a "dancer" mechanism. As carrier strip 40 moves through the apparatus, its tension may become too low for a variety of reasons, causing guide 178 to swing upward from its illustrated position, so that the light beam from a photocell pair 179 is broken by arm 165. On the other hand, arm 165 may move downward due to an increase in the tension in carrier strip 40, so that the light beam from a further photocell pair 181 is broken, indicating application of excessive tension. Between these extremes, which can be adjusted readily for a given application, the acceptable range of tension in carrier strip 40 can be established, as will be understood by those skilled in the art. Depending on the status of photocells 179, 181, or any other suitable type of alternators, motor 142 is started, stopped, slowed or speeded by the controller shown in FIG. 11, in order to maintain the desired tension on the carrier strip. An identical, opposite hand system is provided for curved guide 180. To isolate test chamber 116 from reel chambers 120 and 122, brush-type air seals 182, 184, of conventional design, preferably are positioned at openings 150, 160, as indicated schematically in FIG. 10.

A transducer test station 186 according to the present invention is illustrated in FIGS. 3, 4, 8 and 9. Test station 186 is positioned adjacent guide 152 in approximately the center of chamber 116. In the illustrated embodiment, provision has been made for simultaneously testing four transducers; however, more or fewer transducers may be tested without departing from the scope of the present invention. Station 186 comprises a ball slide 188 attached to the underside of table 114. A connecting plate 190 is mounted to the underside of ball slide 188 for movement in a plane parallel to table 114 in directions transverse to the axis of guide 152. An actuator rod 192 is attached to plate 190 at its inner end and extends through suitable guides to a location at which its outer end is pivotably attached to an operators control handle 194 which in turn is pivotably mounted at 195. Handle 194 extends upwardly through an opening 196 provided in the upper wall of a box channel 198 which extends across the front of the apparatus as shown in FIG. 8. An upholstered arm rest cushion is provided on the front surface of box channel 198 for the comfort of the operator. If desired, ball slide 188 can be actuated by an air cylinder, electric motor and transmission, or the like, without departing from the scope of the invention.

As shown in FIGS. 8 and 9, a pair of support legs 202, 204 extend upwardly from connecting plate 190 through a pair of openings 206, 208 which lead through table 114 into chamber 116. Brush type air seals, not illustrated, also may be provided at openings 206, 208 to minimize flow of air from chamber 116 during operation. At their upper ends, support legs 202, 204 are attached to an elongated probe support channel 210 having an inverted-U cross-section. Support channel 210 extends in parallel to guide 152 so that when handle 194 is rotated, channel 210 moves toward and away from guide 152 and the transducers supported on the guide by carrier strip 40 and fixtures 44. The opposite legs of support channel 210 are provided as shown in FIGS. 8 and 9 with apertures for supporting at each testing substation an electrical connector socket 212 for mating with connector plug 14, a pneumatic probe 214 suitably configured for mating with connector fitting 24 and a plug probe 216 for mating with and closing connector 118 to prevent leakage during testing.

Above each socket 212, channel 210 also supports an automatic part marking assembly 218 used to identify transducers whose performance does not satisfy pretermined requirements. Alternatively, a single marking assembly can be provided at each end of support channel 210 to mark defective transducers as carrier strip 40 moves through the apparatus in either direction. In either situation, assembly 218 comprises a tapered mounting block 220 having an upstanding solenoid anchor plate 222 at its higher end. A ball slide 224 is attached to block 220 and a solenoid 226 is attached to ball slide 224, the plunger of the solenoid being attached to anchor plate 222, as illustrated. A suitable disposable marking pen 228 or the like is supported on slide 224 by a holder clip 230. Thus, when solenoid 226 is energized, it moves pen 228 to the left as illustrated in FIG. 8 so that a defective transducer is marked on its connector plug 14.

In operation, a group of four or more transducers is positioned before test station 186. The operator then pushes handle 194 toward test chamber 116 so that each of socket 212, probe 214 and plug probe 216 is engaged with its counterpart on an adjacent transducer. As the probes are engaged, a limit switch 232 is actuated by a stop 234 on actuator rod 192, thereby signaling a controller 236 that a group of transducers is ready for testing. Controller 236 then directs pneumatic pressure through probe 214 and electrical power to socket 212 so that each transducer is energized. A cycle of changing pressure levels may be applied to each transducer and its performance measured at each level. If the performance of the transducer is unacceptable, marking assembly 218 is actuated by controller 236 to identify the defective transducer.

FIG. 10 illustrates schematically the system used to control the temperatures in chambers 116, 120 and 122. Preferably, the temperature in each chamber is controlled separately from that of the others in order to speed up the testing procedure, in the manner now to be described. Thus, each chamber has its own conventional air heating/cooling unit 250, 252, 254 and associated blower 256, 258, 260 for circulating heated or cooled air through the chamber. Conventional set-point controllers 262, 264, 266 are provided with associated thermocouples 268, 270, 272 which monitor the temperature in each of chambers 116, 120 and 122. In a typical testing cycle in which each transducer is to be tested at two temperatures, chambers 116 and 120 are brought to temperature $T_1$ and chamber 122 is brought to temperature $T_2$. Carrier strip 40 is then stepped from chamber 120 through chamber 116, where testing is performed at temperature $T_1$, and on into chamber 122. The temperature in chamber 116 is then raised to temperature $T_2$ and carrier strip 40 is stepped from chamber 122 through chamber 116, where testing is performed at temperature $T_2$, and on into chamber 120. After the reel in chamber 120 has cooled sufficiently to permit handling, it is removed. If it is desired to test or calibrate at three temperatures, the preceding steps are repeated except that after testing at temperature $T_2$, the temperature in chambers 116 and 120 is raised to temperature $T_3$ and the temperature in chamber 122 is reduced to ambient or less. Tests are then run at temperature $T_3$, after which the tested transducers may be removed from chamber 122 on take-up reel 126. Other possible testing sequences may be used without departing from the scope of the present invention, depending upon whether or not the particular installation of an apparatus according to the invention permits reels to be installed and removed from both sides of the machine.

FIG. 11 shows a schematic illustration of a system useful for controlling movement of carrier strip 40 through the apparatus illustrated in FIGS. 3–10. A conventional programmable controller 274, such as Model 2020A manufactured by the Control Technology Corporation of 82 Turnpike Road, Westboro, Mass. 01581 has been found to be suitable. The use of such controllers is well known to those in the art; therefore, its structure and operation will not be discussed in detail. A keyboard 276 is provided at a location convenient for the operator and includes suitable push buttons for instructing the controller to step carrier strip 40 through the apparatus at various speeds in the forward or reverse directions, to maintain the desired tension on carrier strip 40, to stop the carrier strip and to wind the carrier strip onto either of reels 124, 126. In operation, carrier strip 40 is advanced by the operator using the keyboard until the first group of transducers is positioned for testing, with precise positioning being ensured by simultaneous beams at photosensors 174, 176. The first group of transducers is tested in the manner previously described, after which carrier strip 40 is again advanced until the next group is in position for testing or calibrating.

Having described our invention in sufficient detail to enable those skilled in the art to make and use it, we claim:

1. Apparatus for testing devices whose performance varies with temperature, said apparatus comprising:
- a first chamber;
- a second chamber;
- a third chamber;
- an elongated flexible strip having fixture means for holding a plurality of said devices at spaced intervals along said strip;
- first reel means for paying out and reeling in a first coil comprised of said strip and a plurality of said fixture means, said first reel means being located in said first chamber;
- means for guiding said strip from said first chamber, through said second chamber and into said third chamber;
- second reel means for reeling in and paying out a second coil comprised of said strip and a plurality of said fixture means, said second reel means being located in said third chamber;
- means for intermittently moving said strip through said second chamber while transferring said strip between said first and second reel means;
- probe means located in said second chamber for engaging at least one of said devices while held by said fixture means in said second chamber so as to apply test signals to and receive response signals from each of said devices; and,
- temperature control means for maintaining said first chamber at a controlled first temperature so as to bring said first coil substantially to said controlled first temperature, for maintaining said third chamber at a controlled second temperature different from said controlled first temperature so as to bring said second coil substantially to said controlled second temperature, and for changing the temperature of said second chamber so as to maintain said second chamber substantially at said controlled first temperature while said strip is intermittently moved through said second chamber during its transfer from said first reel to said second reel and substantially at said controlled second temperature while said strip is intermittently moved through said second chamber during its transfer from said second reel to said first reel.

2. Apparatus according to claim 1, further comprising means for marking any device whose performance fails to meet a predetermined standard.

3. Apparatus according to claim 1, further comprising a frame member for rotatably supporting said first reel means, and track means for permitting said frame member to move from said first chamber to a position for loading and unloading said first reel means.

4. Apparatus according to claim 3, further comprising a flexible leader strip attached to said second reel means and adapted to extend therefrom through said second chamber, into said first chamber to a position for attachment to said elongated flexible strip.

5. Apparatus according to claim 1, wherein each of said devices comprises a body portion having extending therefrom at least one elongated flexible appendage such as an electrical conductor or fluid conduit with a free end, and said fixture means comprises:

a plurality of means attached to said elongated strip for holding separately each body portion in a fixed position relative to said strip;

a plurality of means attached to said strip for coiling separately each at least one elongated flexible appendage;

a plurality of means attached to said strip for positioning separately each free end to facilitate application and/or receipt of test or response signals to or from each device; and a plurality of means attached to said strip for spacing successive coils of said strip so as to prevent contact between devices in one turn and devices in another turn when said strip is wound on said first or second reel means.

6. Apparatus according to claim 5, wherein each device comprises a first elongated flexible appendage for receiving test signals for the device, and a second elongated flexible appendage for conveying a response signal of the device to an external monitor, each appendage having a free end; and each of said means for positioning each free end positions one of said free ends for receiving signals and the other of said free ends for conveying response signals.

7. Apparatus according to claim 6, wherein said free ends are positioned to face toward one edge of said strip to facilitate applying and receiving said signals.

8. Apparatus according to claim 5, wherein said means for holding, coiling, positioning and spacing are comprised in a single fixture for each device, further comprising a plurality of fasteners for securing each fixture to said elongated strip, said fasteners being located substantially on a line transverse to said elongated strip, whereby flexibility of said strip is substantially unimpaired by the presence of said fixtures thereon.

9. Apparatus according to claim 5, wherein said means for coiling comprises a post member extending outwardly from said strip in a position for facilitating coiling of said at least one elongated appendage thereabout.

10. Apparatus according to claim 9, wherein said means for spacing comprises the outer end of said post member, said outer end being positioned sufficiently far from said strip to ensure that each device is not contacted by successive turns of said strip when said strip is wound on said reel means.

11. The apparatus of claim 1 in which said probe means includes means for simultaneously applying test signals to and receiving response signals from a plurality of said devices.

12. The apparatus of claim 1 in which said temperature control means includes individual temperature maintaining means for each of said first, second and third chambers so that the temperature in each of said chambers is controlled separately from the temperatures of the other chambers.

13. The apparatus of claim 1 in which said temperature cntrol means uses air as a temperature maintaining medium.

14. An apparatus for testing devices whose performance varies with temperature, said apparatus comprising:

fixture means for mounting a plurality of said devices at spaced intervals on an elongated flexible strip;

means for coiling said strip on a first reel so as to provide a first coil comprised of said strip and plurality of said devices;

means for mounting said reel and said first coil in a first chamber;

means for maintaining said first chamber at a controlled first temperature so as to bring said coil substantially to said controlled first temperature;

means for withdrawing said strip from said first reel and intermittently moving said strip through a second chamber;

means for maintaining said second chamber substantially at said controlled first temperature while said strip is being intermittently moved through said second chamber;

probe means located in said second chamber for testing each of said devices as it moves intermittently through said second chamber; and, means for receiving said strip from said second chamber.

15. The apparatus of claim 14 in which said receiving means includes means for withdrawing said strip from said second chamber and coiling said strip on a second reel in a third chamber so as to provide a second coil comprised of said strip and a plurality of said fixture means, and in which said apparatus further includes:

means for maintaining said third chamber at a controlled second temperature different from said controlled first temperature so as to bring said second coil substantially to said controlled second temperature;

means for changing the temperature of said second chamber so as to maintain said second chamber substantially at said controlled second temperature;

means for withdrawing said strip from said second reel and intermittently moving said strip back through said second chamber, said probe means being arranged so as to test each device at said second controlled temperature as it passes back through said second chamber; and, means for receiving said strip from said second chamber after it passes back through said second chamber.

16. The apparatus of claim 15 in which said probe means includes means for simultaneously applying test signals to and receiving response signals from a plurality of said devices.

17. The apparatus of claim 15 in which said temperature control means includes individual temperature maintaining means for each of said first, second and third chambers so that the temperature in each of said chambers is controlled separately from the temperatures of the other chambers.

18. The apparatus of claim 14 in which said temperature control means uses air as a temperature maintaining medium.

19. Apparatus according to claim 14, further comprising means for marking any device whose performance fails to meet a predetermined standard.

20. Apparatus according to claim 14, further comprising a frame member for rotatably supporting said first reel means, and track means for permitting said frame member to move to a position for loading and unloading said first reel means.

21. Apparatus according to claim 20, further comprising a flexible leader strip attached to said second reel means and adapted to extend therefrom through said chamber, to a position for attachment to said elongated flexible strip.

22. Apparatus according to claim 14, wherein each of said devices comprises a body portion having extending therefrom at least one elongated flexible appendage such as an electrical conductor or fluid conduit with a free end, and said fixture means comprises:

a plurality of means attached to said elongated strip for holding separately each body portion in a fixed position relative to said strip;

a plurality of means attached to said strip for coiling separately each at least one elongated flexible appendage;

a plurality of means attached to said strip for positioning separately each free end to facilitate application and/or receipt of test or response signals to or from each device; and a plurality of means attached to said strip for spacing successive coils of said strip so as to prevent contact between devices in one turn and devices in another turn when said strip is wound on said first or second reel means.

23. Apparatus according to claim 22, wherein each device comprises a first elongated flexible appendage for receiving test signals for the device, and a second elongated flexible appendage for conveying a response signal of the device to an external monitor, each appendage having a free end; and each of said means for positioning each free end positions one of said free ends for receiving signals and the other of said free ends for conveying response signals.

24. Apparatus according to claim 23, wherein said free ends are positioned to face toward one edge of said strip to facilitate applying and receiving said signals.

25. Apparatus according to claim 22, wherein said means for holding, coiling, positioning and spacing are comprised in a single fixture for each device, further comprising a plurality of fasteners for securing each fixture to said elongated strip, said fasteners being located substantially on a line transverse to said elongated strip, whereby flexibility of said strip is substantially unimpaired by the presence of said fixtures thereon.

26. Apparatus according to claim 22, wherein said means for coiling comprises a post member extending outwardly from said strip in a position for facilitating coiling of said at least one elongated appendage thereabout.

27. Apparatus according to claim 26, wherein said means for spacing comprises the outer end of said post member, said outer end being positioned sufficiently far from said strip to ensure that each device is not contacted by successive turns of said strip when said strip is wound on said reel means.

28. A method for testing devices whose performance varies with temperature, said method comprising the steps of:

mounting a plurality of said devices on an elongated flexible strip;

coiling said strip on a first reel to provide a first coil comprising said strip and a plurality of said devices;

placing said reel and said first coil in a first enclosure;

maintaining said first enclosure at a controlled first temperature so as to bring said first coil substantially to said controlled first temperature;

intermittently withdrawing said strip from said first reel into a second enclosure while maintaining said second enclosure substantially at said controlled first temperature;

testing each of said devices as it passes through said second enclosure with probe means located in said second chamber for engaging at least one of said devices while held by said fixture means in said second chamber so as to apply test signals to and receive response signals from each of said devices; and, intermittently withdrawing said strip from said second enclosure.

29. A method according to claim 28, further comprising the steps of:

coiling said strip on a second reel in a third enclosure to provide a second coil comprising said strip and a plurality of said devices while maintaining said third enclosure at a controlled second temperature different from said controlled first temperature so as to bring said second coil substantially to said controlled second temperature;

changing the temperature in said second enclosure substantially to said controlled second temperature;

intermittently withdrawing said strip from said second reel back into said second enclosure while maintaining said second enclosure substantially at said controlled second temperature;

again testing each device as it passes in reverse through said second enclosure with said probe means; and intermittently withdrawing said strip from said second enclosure and coiling it again on said first reel.

* * * * *